(12) United States Patent
Schwarzenbach et al.

(10) Patent No.: US 11,127,624 B2
(45) Date of Patent: Sep. 21, 2021

(54) METHOD OF MANUFACTURING A SEMICONDUCTOR ON INSULATOR TYPE STRUCTURE, NOTABLY FOR A FRONT SIDE TYPE IMAGER

(71) Applicant: Soitec, Bernin (FR)

(72) Inventors: Walter Schwarzenbach, Saint Nazaire les Eymes (FR); Oleg Kononchuk, Theys (FR); Ludovic Ecarnot, Grenoble (FR)

(73) Assignee: Soitec, Bernin (FR)

( * ) Notice: Subject to any disclaimer, the term of this patent is extended or adjusted under 35 U.S.C. 154(b) by 48 days.

(21) Appl. No.: 16/495,362

(22) PCT Filed: Mar. 21, 2018

(86) PCT No.: PCT/EP2018/057151
§ 371 (c)(1),
(2) Date: Sep. 18, 2019

(87) PCT Pub. No.: WO2018/172405
PCT Pub. Date: Sep. 27, 2018

(65) Prior Publication Data
US 2020/0152689 A1    May 14, 2020

(30) Foreign Application Priority Data
Mar. 21, 2017 (FR) ...................... 1752310

(51) Int. Cl.
*H01L 21/762* (2006.01)
*H01L 27/146* (2006.01)
(Continued)

(52) U.S. Cl.
CPC .... *H01L 21/76254* (2013.01); *H01L 21/0245* (2013.01); *H01L 21/02381* (2013.01);
(Continued)

(58) Field of Classification Search
CPC ......... H01L 21/76251–76259; H01L 21/2033; H01L 21/2053; H01L 21/2007; H01L 21/2015
See application file for complete search history.

(56) References Cited

U.S. PATENT DOCUMENTS

2006/0292822 A1   12/2006 Xie
2007/0023066 A1*   2/2007 Yokokawa ........ H01L 21/76254
                                                     134/1.3
(Continued)

FOREIGN PATENT DOCUMENTS

EP           0251897 B1    3/1989
EP           0646286 B1    10/2002
(Continued)

OTHER PUBLICATIONS

International Search Report for International Application No. PCT/EP2018/057151 dated Jun. 27, 2018, 3 pages.
(Continued)

*Primary Examiner* — Scott B Geyer
(74) *Attorney, Agent, or Firm* — TraskBritt

(57) ABSTRACT

A semiconductor on insulator type structure, which may be used for a front side type imager, successively comprises, from its rear side to its front side, a semiconductor support substrate, an electrically insulating layer and an active layer comprising a monocrystalline semiconductor material. The active layer is made of a semiconductor material having a state of mechanical stress with respect to the support substrate, and the support substrate comprises, on its rear side, a silicon oxide layer, the thickness of the oxide layer being chosen to compensate bow induced by the mechanical stress between the active layer and the support substrate during cooling of the structure after the formation by epitaxy of at least a part of the active layer on the support substrate.

13 Claims, 7 Drawing Sheets

(51) Int. Cl.
*H01L 31/028* (2006.01)
*H01L 21/02* (2006.01)
*H01L 21/203* (2006.01)

(52) U.S. Cl.
CPC .... *H01L 21/02532* (2013.01); *H01L 21/2033* (2013.01); *H01L 27/14643* (2013.01); *H01L 27/14683* (2013.01); *H01L 31/028* (2013.01)

(56) References Cited

U.S. PATENT DOCUMENTS

| | | | | |
|---|---|---|---|---|
| 2007/0277728 | A1* | 12/2007 | Sadaka | C30B 29/52 117/43 |
| 2009/0042364 | A1* | 2/2009 | Yagi | H01L 21/76254 438/459 |
| 2010/0001322 | A1* | 1/2010 | Euen | H01L 21/76254 257/213 |
| 2015/0249035 | A1* | 9/2015 | Aga | H01L 27/12 438/458 |
| 2016/0118431 | A1 | 4/2016 | Dutartre | |
| 2017/0338143 | A1* | 11/2017 | Peidous | H01L 21/76254 |

FOREIGN PATENT DOCUMENTS

| | | |
|---|---|---|
| EP | 1811543 A1 | 7/2007 |
| WO | 93/26041 | 12/1993 |

OTHER PUBLICATIONS

International Written Opinion for International Application No. PCT/EP2018/057151 dated Jun. 27, 2018, 6 pages.

\* cited by examiner

METHOD OF MANUFACTURING A SEMICONDUCTOR ON INSULATOR TYPE STRUCTURE, NOTABLY FOR A FRONT SIDE TYPE IMAGER

CROSS-REFERENCE TO RELATED APPLICATIONS

This application is a national phase entry under 35 U.S.C. § 371 of International Patent Application PCT/EP2018/057151, filed Mar. 21, 2018, designating the United States of America and published as International Patent Publication WO 2018/172405 A1 on Sep. 27, 2018, which claims the benefit under Article 8 of the Patent Cooperation Treaty to French Patent Application Ser. No. 1752310, filed Mar. 21, 2017.

TECHNICAL FIELD

The present disclosure relates to a semiconductor on insulator type structure, notably for a "front side" type imager, an imager incorporating such a structure, and a method of manufacturing such a structure.

BACKGROUND

Semiconductor on insulator type structures (SeOI), which successively comprise a support substrate, an electrically insulating layer and a thin semiconductor layer, have numerous applications in the field of microelectronics, optics and optoelectronics.

One of these applications is for use in imagers.

U.S. Patent Application Publication No. 2016/0118431 describes a "front side" type imager.

As illustrated in FIG. 1, the imager comprises a SOI (Silicon-On-Insulator) type structure comprising, from its rear side to its front side, a silicon support substrate 1' having a certain doping, a silicon oxide layer 2', and a monocrystalline silicon layer 3', which is referred to as an "active layer" having a doping, which can be different from that of the support substrate 1'. A matrix array of photodiodes each defining a pixel is arranged in the monocrystalline silicon layer 3'.

However, such an imager has low sensitivity in the near infrared region of the electromagnetic spectrum, that is to say for wavelengths between 700 nm and 3 µm.

Indeed, the active silicon layer 3' has a coefficient of absorption that decreases markedly with the wavelength of the radiation to which it is exposed, namely from around $10^6$ $cm^{-1}$ for a wavelength of 300 nm to several $10^3$ $cm^{-1}$ for a wavelength of 700 nm.

However, monocrystalline silicon is currently the favored material to form the active layer of the substrate for the imager, because it has the advantage of being compatible with microelectronic methods enabling the manufacture of the imager and of presenting a crystalline quality (notably an absence of dislocations) suitable to the function of the active layer.

To improve the sensitivity of the imager in the near infrared, monocrystalline silicon-germanium (SiGe) is another material that could be considered for the active layer, because it advantageously has a coefficient of absorption in the near infrared that increases with increasing germanium content thereof.

In so far as a bulk monocrystalline silicon-germanium substrate does not exist, the formation of a monocrystalline SiGe layer of sufficient thickness (on the order of a micrometer) for the targeted application would involve epitaxial deposition of SiGe on a silicon on insulator type structure (heteroepitaxy) or on a SiGe on insulator structure—noted hereafter SiGeOI—(homoepitaxy). Such an epitaxy would typically be implemented at a temperature on the order of 900° C. In both cases, the support substrate of the structure would be made of silicon.

Yet, due to the stress in the silicon-germanium that is compressed when a critical thickness (described later) is not exceeded, the epitaxial structure undergoes a deformation that results in a bow, defined as being the distance between the center of the structure and a plane containing the edge of the structure, which can reach values well above 250 µm. Yet, a structure having such a bow would be difficult to handle with conventional industrial tools, which are designed for flat substrates.

European Patent Publication No. EP 2 251897 addresses the compensation of the deformation caused by epitaxy of a silicon-germanium layer on the front side of a silicon substrate. To this end, this document proposes a method wherein a SiGe layer is deposited on the rear side of the siliconsubstrate in such a way as to compensate the deformation brought about by the deposition of the SiGe layer on the front side of the substrate. More specifically, this method comprises the following successive steps:

(a) simultaneously polishing both faces (DSP, acronym for "double side polishing") of the silicon substrate until a suitable thickness is obtained given the thickening caused by the later deposition of SiGe layers on the front and rear sides, (b) forming by epitaxy a SiGe layer on the rear side of the silicon substrate, so as to cause a deformation that will be compensated by the later deposition of the SiGe layer on the front side, (c) polishing and cleaning the front side of the silicon substrate; and (d) forming by epitaxy a SiGe layer on the front side of the silicon substrate.

However, this method is applied to a bulk silicon substrate having a thickness of several hundreds of micrometers, but it is not applicable to an SOI or SiGeOI type structure in which the thickness of the silicon or SiGe layer is on the order of a micrometer, because the double side polishing step would destroy the thin layer.

Furthermore, at the end of step (b), the structure is highly deformed, which makes it difficult to handle with a view to the polishing and the formation by epitaxy of the SiGe layer on the front side of the silicon substrate.

Thus, there exists a need to enable epitaxy of monocrystalline SiGe on an SOI or SiGeOI type structure that preserves the flatness of the structure throughout the manufacture thereof.

BRIEF SUMMARY

An aim of the present disclosure is to overcome the aforementioned problem and to propose a semiconductor on insulator type substrate comprising an epitaxial SiGe layer—or more generally a monocrystalline semiconductor layer having a state of mechanical stress—and making it possible to compensate for the deformation induced by the stress. Notably, this structure must be able to be used for a front side type imager to increase the absorption of light in the near infrared region of the electromagnetic spectrum while respecting the constraints of compatibility with the method of manufacturing the imager and the crystalline quality of the active layer.

To this end, the present disclosure proposes a semiconductor on insulator type structure, notably for a front side type imager, successively comprising from its rear side to its front side a semiconductor support substrate, an electrically insulating layer and a monocrystalline semiconductor layer referred to as the "active layer," characterized in that the active layer is made of a semiconductor material having a state of mechanical stress with respect to the support substrate, and in that the support substrate comprises, on its rear side, a silicon oxide layer, the thickness of the oxide layer being chosen to compensate the bow induced by the mechanical stress between the active layer and the support substrate during cooling of the structure after the formation by epitaxy of at least a part of the active layer on the support substrate.

As used herein, the term "front side" means the side of the imager intended to be exposed to light radiation, and is located on the same side of the substrate as the associated electronic components.

As used herein, the term "state of mechanical stress with respect to the support substrate" means the considered layer has a compressive or extensive stress different from that potentially present in the support substrate, and capable of inducing a deformation of the assembly formed of the layer and the support substrate at room temperature (room temperature being defined as a temperature between 20 and 25° C.). This state of mechanical stress is due notably to a difference in coefficient of thermal expansion between the layer and the support substrate.

According to a preferred embodiment, the active layer is a silicon-germanium layer.

Advantageously, the germanium content of the active layer is less than or equal to 10%.

Preferably, the thickness of the active layer is less than a critical thickness defined as being a thickness beyond which relaxation of the material of the active layer takes place.

According to one embodiment, the structure further comprises a silicon layer between the electrically insulating layer and the active layer.

According to one embodiment, the electrically insulating layer is made of silicon oxide.

The thickness of the electrically insulating layer is typically between 10 and 200 nm.

The thickness of the silicon oxide layer situated on the rear side of the substrate may be between 0.5 µm and 4 µm.

The present disclosure also relates to a front side imager comprising such a structure and a matrix array of photodiodes in the active layer of the structure.

Another object of the present disclosure relates to a method of manufacturing such a structure. The method comprises the following steps:

supplying a donor substrate comprising a semiconductor material suitable for the epitaxial growth of the material of the active layer;

supplying the support substrate;

bonding the donor substrate on the support substrate, the electrically insulating layer being at the bonding interface;

thinning the donor substrate so as to transfer a layer of the semiconductor material onto the front side of the support substrate;

depositing the silicon oxide layer on the rear side of the support substrate; and after the deposition of the oxide layer, epitaxially growing, on the transferred layer of semiconductor material, the active layer, at a temperature greater than the deposition temperature of the oxide layer.

According to a preferred embodiment, the active layer is made of silicon-germanium.

According to one embodiment of the present disclosure, the semiconductor material of the donor substrate suitable for the epitaxial growth of silicon-germanium is silicon-germanium.

The semiconductor material is formed by epitaxy on a base substrate, the semiconductor material and the base substrate together forming the donor substrate.

According to another embodiment, the semiconductor material of the donor substrate suitable for the epitaxial growth of silicon-germanium is silicon.

The thickness of the silicon layer transferred onto the support substrate is advantageously less than or equal to 400 nm.

At the end of the epitaxial growth of silicon-germanium, the silicon layer may remain between the electrically insulating layer and the silicon-germanium layer.

Alternatively, the method may comprise a step of condensation of the silicon-germanium of the active layer so as to convert the silicon layer from which the epitaxial growth of silicon-germanium has been carried out into a silicon-germanium layer.

According to one embodiment, the method comprises a step of forming an embrittlement zone in the donor substrate so as to delimit a layer of the semiconductor material suitable for the epitaxial growth of the material of the active layer, and the thinning of the donor substrate comprises a detachment along the embrittlement zone.

The formation of the embrittlement zone advantageously comprises an implantation of atomic species in the donor substrate.

The epitaxy temperature of the active layer may be between 600 and 1100° C.

The deposition temperature of the silicon oxide layer may be between 100 and 400° C.

In a particularly advantageous manner, the thickness of the silicon oxide layer is selected such that the stress generated during cooling of the structure after the deposition of the layer due to the difference in coefficient of thermal dilatation with the support substrate causes a bow less than a limit value.

BRIEF DESCRIPTION OF THE DRAWINGS

Other characteristics and advantages of the present disclosure will become clear from reading the detailed description that follows, with reference to the appended drawings, in which.

For reasons of legibility of the figures, the different layers are not necessarily drawn to scale.

DETAILED DESCRIPTION

Figure 1:
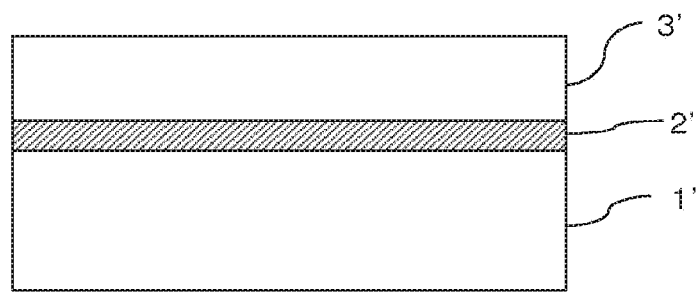
FIG. 1 is a sectional view of a known SOI structure for a front side imager.
Figure 2:
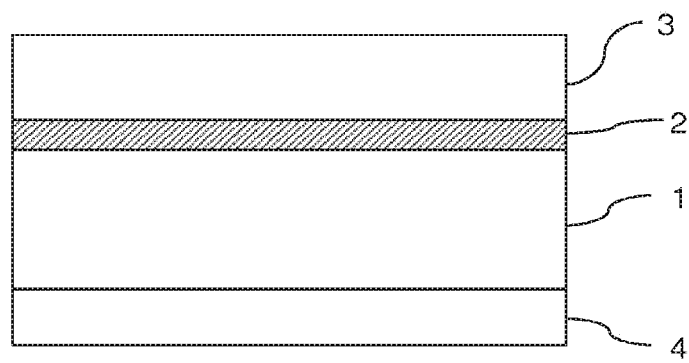
FIG. 2 is a sectional view of a structure according to one embodiment of the present disclosure.

FIG. 2 is a sectional view of a semiconductor on insulator substrate according to one embodiment of the present disclosure. Such a substrate can notably be used for the manufacture of a front side type imager, but is not limited to such an application.

The substrate successively comprises, from its rear side to its front side, a silicon oxide ($SiO_2$) layer 4, a semiconductor support substrate 1, an electrically insulating layer 2 and a monocrystalline semiconductor layer 3, which is the active layer.

In the remainder of the description, it will be considered that the active layer 3 is a silicon-germanium (SiGe) layer, but the present disclosure is not limited to this material, the active layer also being able to be formed of another semiconductor material, such as germanium or a III-V material, having a state of mechanical stress with respect to the support substrate.

The support substrate 1 is generally obtained by cutting a monocrystalline ingot. Advantageously, the support substrate 1 is made of silicon.

According to one embodiment, the electrically insulating layer is a silicon oxide layer.

The thickness of the electrically insulating layer may be between 10 and 200 nm.

The active layer 3 is intended to form the active layer of an electronic, optic or optoelectronic component. Thus, in application to an imager, the active layer 3 is intended to receive or include a matrix array of photodiodes (not represented) enabling the capture of images. The thickness of the active layer 3 is typically greater than or equal to 1 µm. The layer 3 may be lightly doped.

Figure 3:
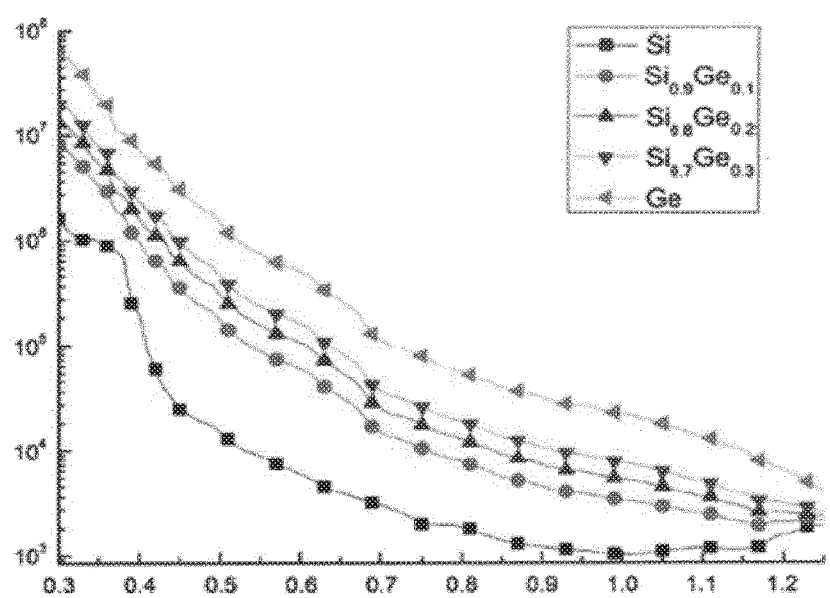
FIG. 3 shows the coefficient of absorption of silicon-germanium as a function of wavelength for different germanium contents.

As may be seen in FIG. 3, which illustrates the coefficient of absorption (in cm 1) of SiGe as a function of wavelength (in µm) for different compositions of the material, the coefficient of absorption, notably in the infrared, increases with the germanium content.

However, the design of the active layer 3 does not only concern the concentration of germanium but also the thickness of the layer. Indeed, since the SiGe layer is formed by epitaxy on a silicon substrate, the lattice parameter of which is different from that of silicon-germanium, relaxation of the SiGe layer takes place beyond a certain thickness known as the "critical thickness." This relaxation results in the formation of dislocations within the SiGe layer.

Such dislocations would make the SiGe layer inappropriate for the function of the active layer 3 and, thus, must be avoided.

Figure 4:
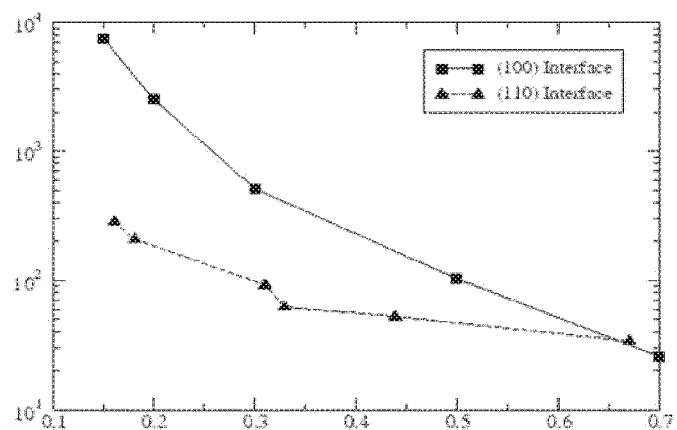
FIG. 4 shows the critical thickness of a silicon layer-germanium as a function of the germanium content thereof.

As shown in FIG. 4, which illustrates the critical thickness (in Å) of a SiGe layer as a function of the germanium content (stoichiometric coefficient x corresponding to the composition $Si_{1-x}Ge_x$), the critical thickness is becomes smaller with increasing germanium concentration.

The thickness of the active layer 3 and the germanium concentration of the layer thus result from a compromise between:

on the one hand, a sufficiently large thickness to capture a maximum of photons in the wavelengths of the near infrared region of the electromagnetic spectrum, on the other hand, a sufficient concentration of germanium to increase the capacity to absorb photons by the active layer, in particular, in the near infrared region; and a limited thickness (dependent on the concentration) to avoid silicon-germanium relaxation and the creation of crystalline defects (dislocations) that result therefrom.

Typically, it is sought to maximize the thickness and the germanium concentration of the active layer 3 in order to have the best possible absorption in the infrared region.

Preferably, the germanium content of the active layer is less than or equal to 10%. FIG. 4 shows that the critical thickness of a $Si_{0.9}Ge_{0.1}$ layer is on the order of a micrometer, which is suitable for the active layer of a "front side" type imager.

Figure 5:
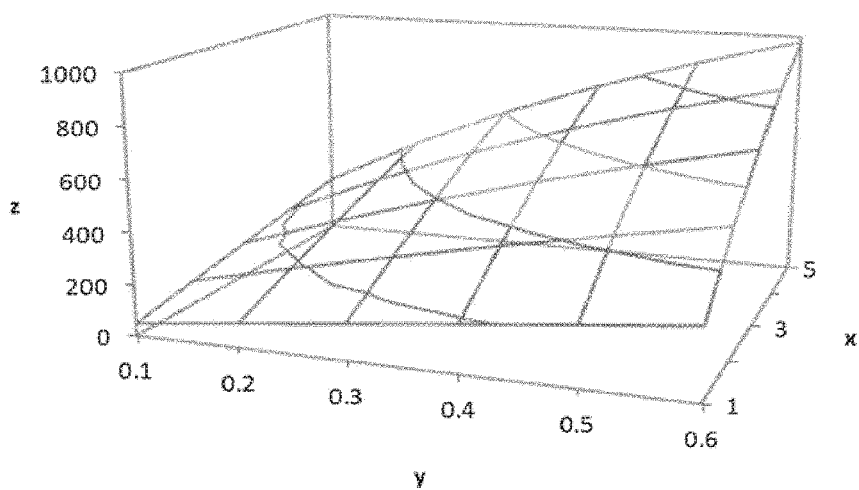
FIG. 5 represents the bow of a silicon substrate with a stressed SiGe layer epitaxied on its front side; this bow is plotted as a function of the stress in the SiGe and the thickness of SiGe.

FIG. 5 illustrates the bow z (in µm) of a silicon substrate of 300 mm diameter and having a thickness of 775 µm as a function of the thickness x (in µm) of a SiGe layer deposited by epitaxy on the substrate, and the stress y (in GPa) in the SiGe layer, the stress depending on the germanium content and the thickness of the SiGe layer.

Thus, for example, a SiGe layer having a thickness of 5 µm induces a stress of 0.1 GPa, which causes a bow on the order of +300 m.

The silicon oxide layer 4 arranged on the rear side of the support substrate 1 makes it possible to compensate the deformation induced by the stress of the active layer.

As will be seen below in the description of embodiments of the method of manufacturing the structure, the silicon oxide layer is deposited on the support substrate before epitaxy of the SiGe layer, at a sufficiently low temperature so as not to significantly deform the structure before the epitaxy step. Thus, the structure can still be handled by conventional industrial tools throughout its method of manufacture.

Examples of methods of manufacturing the structure illustrated in FIG. 2 will now be described.

Generally speaking, the method of manufacturing the structure comprises the following steps.

A donor substrate is supplied comprising a semiconductor material suitable for the epitaxial growth of silicon-germanium. The material may notably be SiGe (enabling homoepitaxy) or a material different from SiGe but having a lattice parameter sufficiently close to that of SiGe to enable the epitaxial growth thereof (heteroepitaxy). In this latter case, the semiconductor material may be silicon.

A receiver substrate is also supplied, and the donor substrate is bonded on the receiver substrate, an electrically insulating layer being present at the bonding interface between the receiver substrate and the donor substrate.

The donor substrate is then thinned so as to transfer a layer of the semiconductor material onto the receiver substrate.

This thinning may be carried out by polishing or etching of the semiconductor material so as to obtain the thickness and the surface state desired for the epitaxy of SiGe.

However, before the bonding step, an embrittlement zone may be formed in the semiconductor material so as to delimit a superficial layer to be transferred to the receiver substrate. After the bonding step, the thinning step involves detaching the donor substrate along the embrittlement zone, which leads to the transfer of the superficial layer onto the receiver substrate. Typically, the thickness of the transferred layer is less than or equal to 400 nm. Potentially, a finishing treatment of the free surface of the transferred layer is carried out in order to favor the implementation of the epitaxy, this treatment leading to thinning of the transferred layer.

Next, a silicon oxide ($SiO_2$) layer is deposited on the rear side of the receiver substrate. Such a deposition is implemented at a relatively low temperature, substantially less than the epitaxy temperature required to for the subsequent growth of the monocrystalline SiGe layer. Typically, the deposition temperature of the oxide layer is on the order of 300° C., more generally between 100 and 400° C. The techniques for carrying out such a deposition are known, and may be include PECVD (Plasma-Enhanced Chemical Vapor Deposition) for example.

Considering that the coefficient of thermal expansion of silicon oxide is constant as a function of temperature, the stress induced by the deposition of the layer on the receiver substrate results, after returning to room temperature, in a bow of 6 μm for 1000 Å deposited at 300° C., the bow being 18 μm for 1000 Å deposited at 950° C.

The thickness of the deposited silicon oxide layer is chosen so that the bow obtained after returning to room temperature is less than or equal to a limit value, for example, less than or equal to 100 μm, which makes it possible to handle and to measure the structure with standard microelectronic equipment. This thickness of the silicon oxide layer is typically between 0.5 μm and 4 μm.

Finally, on the transferred layer of semiconductor material, which serves as seed layer, the epitaxial growth of a silicon-germanium layer is implemented until the desired thickness for the active layer is obtained. This epitaxy is typically carried out at a temperature on the order of 900° C., more generally between 600 and 1100° C.

Since the epitaxy is carried out at a temperature close to the glass transition temperature of the silicon oxide layer situated on the rear side, the silicon oxide layer creeps during the epitaxy, which reduces the stress created by the layer. On the other hand, in so far as the layer has been taken to a temperature three times greater than that of its deposition, the stress created during its post-epitaxy cooling is also around three times greater than that created during its cooling following its deposition.

Consequently, the deposition of the SiGe layer induces a double phenomenon:
  a positive variation of the bow, linked to the stress created by the SiGe on the front side; and
  a negative variation of the bow, induced by the stress created by the silicon oxide on the rear side.

On returning to room temperature, the two variations offset one another, making it possible to benefit from an SOI or SiGeOI structure covered by a thick non-deformed SiGe layer.

Thereafter, since the processing steps to which the structure is subjected in the manufacture of the imager or another electronic, optic or optoelectronic component are implemented at temperatures below the SiGe epitaxy temperature, the structure will become substantially flat upon returning to room temperature.

It will be noted that, when the seed layer is not made of SiGe, such as when it is made of silicon, the seed layer remains under the active layer 3 at the end of the SiGe epitaxy.

Figure 6:
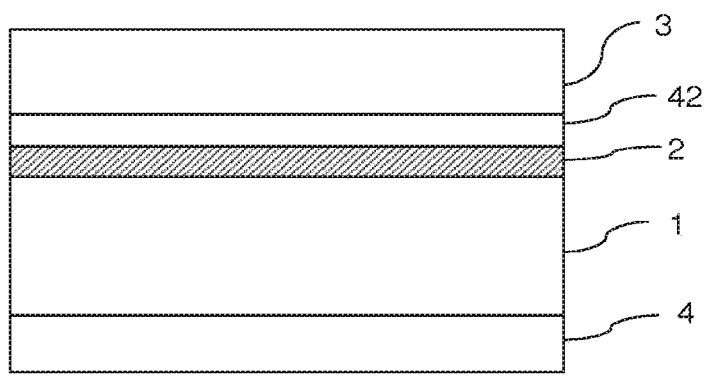
FIG. 6 is a sectional view of a substrate according to an alternative embodiment of the present disclosure.

This situation is illustrated in FIG. 6, which corresponds to one particular embodiment of the present disclosure. The seed layer is designated by the reference numeral 42.

The seed layer is sufficiently thin (of a thickness less than or equal to 300 nm) compared to the thickness of the active layer so as not to significantly affect the properties of the active SiGe layer in terms of absorption in the infrared region.

However, it is possible to remove the seed layer, for example, by means of a condensation method. In a known manner, the method may comprise an oxidation of the SiGe layer, the oxidation having the effect of consuming the silicon (to form silicon oxide) and to make the germanium migrate to the face opposite to the free surface of the SiGe layer. A $SiO_2$ layer, which can be removed by etching, is then obtained on the surface.

According to a first embodiment, illustrated in FIGS. 7A to 7F, the starting point is a donor substrate 30 comprising a superficial SiGe layer 31.

The SiGe layer is typically formed by epitaxy on a base substrate 32, which may be made of silicon. The SiGe layer is sufficiently thin to be stressed.

In a first version of this embodiment, an embrittlement zone is formed in the SiGe layer.

Figure 7A:
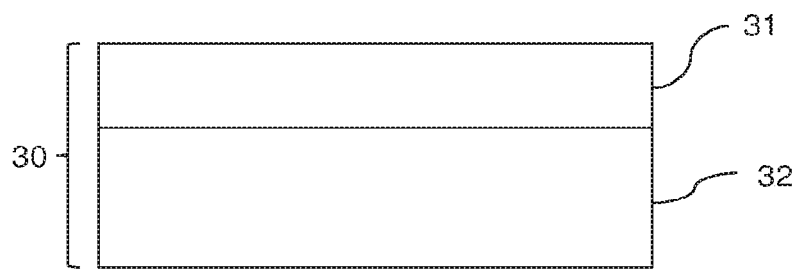
FIGS. 7A to 7G illustrate the main steps of a method of manufacturing a structure according to one embodiment of the present disclosure.
Figure 7B:
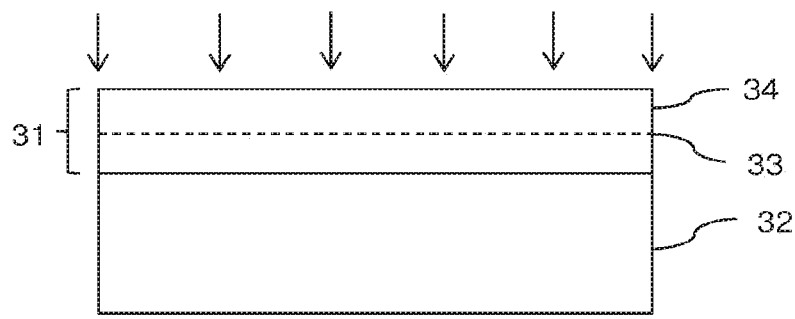

In a particularly advantageous manner, as illustrated in FIG. 7B, the embrittlement zone 33 is formed by implantation of atomic species (typically, hydrogen and/or helium) through the free surface of the SiGe layer 31. The embrittlement zone 33 thereby delimits a SiGe layer 34 at the surface of the donor substrate.

Figure 7C:
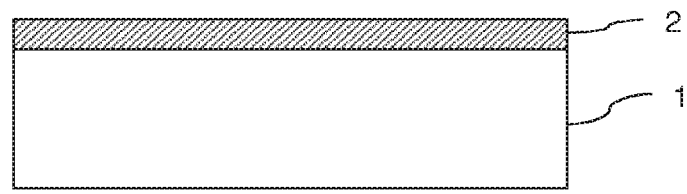

With reference to FIG. 7C, a receiver substrate is also supplied that includes a support substrate 1 and an electrically insulating layer 2.

Figure 7D:
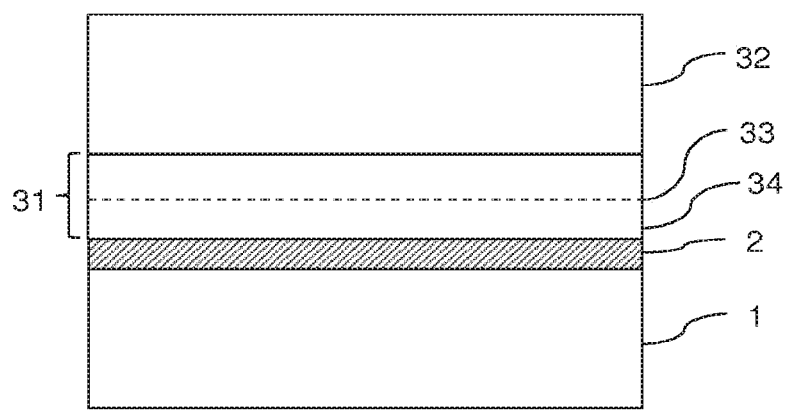

With reference to FIG. 7D, the donor substrate is bonded to the receiver substrate, the SiGe layer 31 and the electrically insulating layer 2 being at the bonding interface.

Figure 7E:
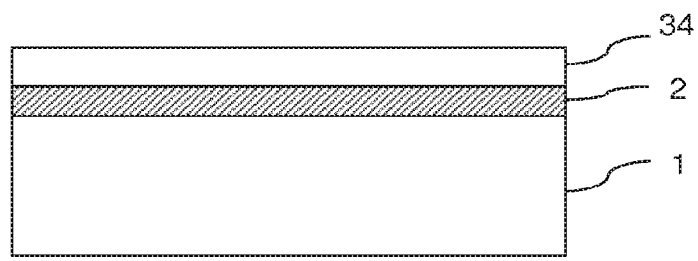

Next, as illustrated in FIG. 7E, the donor substrate is detached along the embrittlement zone. The detachment may be initiated by any known technique, such as by application of mechanical, chemical, and/or thermal stress.

The SiGe layer 34 is thereby transferred onto the support substrate.

Figure 7F:
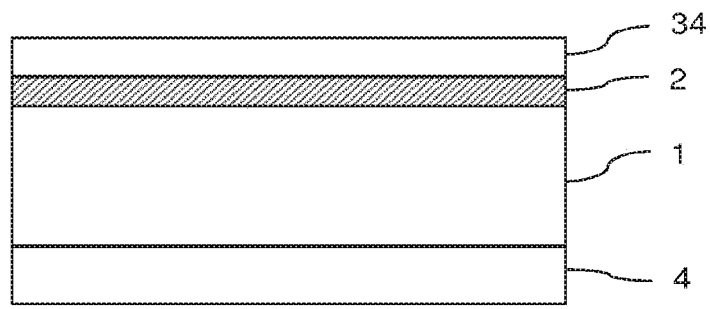

With reference to FIG. 7F, a silicon oxide layer 4 is deposited at low temperature (on the order of 300° C.) on the rear side of the support substrate 1. As indicated above, the thickness of the layer 4 is chosen so as not to generate a bow greater than 100 μm upon returning to room temperature, and to compensate the bow generated by the later epitaxy of the SiGe layer. The thickness of the layer 4 is, for example, on the order of 1.4 μm.

If need be, a surface treatment of the SiGe layer is carried out to remove defects linked to the implantation and to the detachment, and to make it sufficiently smooth for the subsequent epitaxy step (cf. FIG. 7H described below).

Figure 8A:
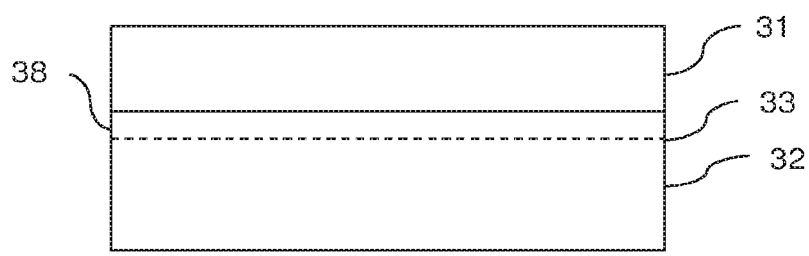
FIGS. 8A to 8C illustrate the steps of an alternative of the manufacturing method illustrated in FIGS. 7A to 7F.

In a second version of this embodiment, an embrittlement zone 33 is formed in the donor substrate 30 situated under the SiGe layer 31 (cf FIG. 8A).

In a particularly advantageous manner, the embrittlement zone 33 is formed by implantation of atomic species (typically, hydrogen and/or helium) through the free surface of the donor substrate 30. The embrittlement zone 33 thus delimits a SiGe layer and a portion 38 of the base substrate 32 at the surface of the donor substrate.

A receiver substrate comprising a support substrate 1 and an electrically insulating layer 2 (cf. FIG. 7C) is also provided.

Figure 8B:
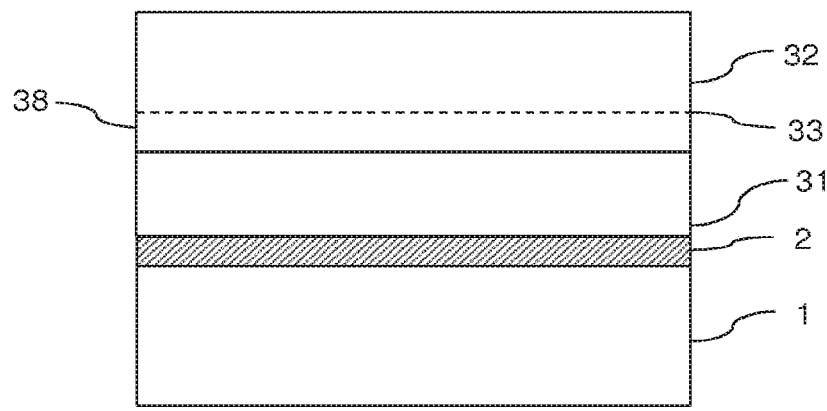

With reference to FIG. 8B, the donor substrate is bonded to the receiver substrate, the SiGe layer 31 and the electrically insulating layer 2 being at the bonding interface.

Next, the donor substrate is detached along the embrittlement zone 33. The detachment may be initiated by any known technique, such as by application of mechanical, chemical, and/or thermal stress.

Figure 8C:
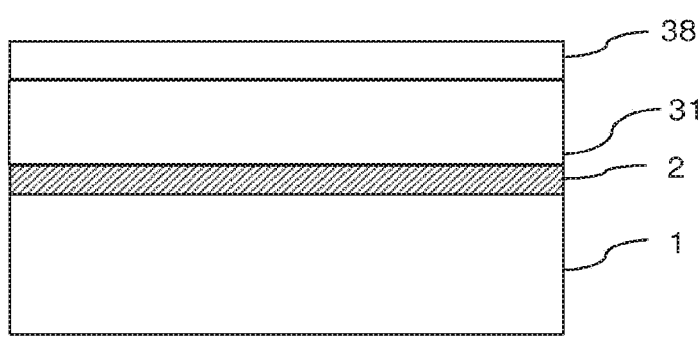

The SiGe layer 31 and the portion 38 of the base substrate are thereby transferred onto the support substrate (cf. FIG. 8C).

A treatment of the surface created is then carried out to remove the portion 38 of the superficial donor substrate until a surface of SiGe is revealed, thereby removing defects linked to the implantation and to the detachment, and making it sufficiently smooth for the subsequent epitaxy process.

As in FIG. 7E, a portion 38 of the SiGe layer 31 on the support substrate 1 is thereby obtained.

With reference to FIG. 7F, a silicon oxide layer 4 is deposited at low temperature (on the order of 300° C.) on the rear side of the support substrate 1. As indicated above, the thickness of the layer 4 is chosen so as not to generate a bow greater than 100 µm upon return to room temperature, and to compensate the bow generated by the later epitaxy of the SiGe layer. The thickness of the layer 4 is, for example, on the order of 1.4 µm.

Figure 7G:
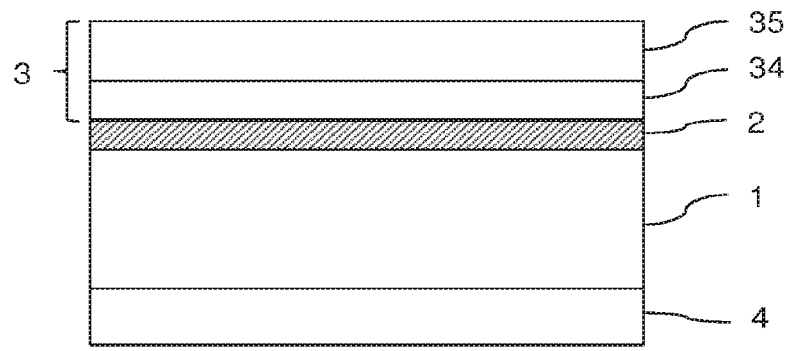

As illustrated in FIG. 7G (step common to both versions of the embodiment), epitaxy is then performed in order to make a SiGe layer 35 grow on the transferred layer 34, which fulfils the role of a seed layer, until the desired thickness for the active layer 3 is obtained, which is includes both of the two SiGe layers 34 and 35. During epitaxy, it is possible to lightly dope the layer 35, according to the desired electrical properties. The doping of the layer 35 is not necessarily identical to that of the seed layer 34.

During this epitaxy, which is carried out at a temperature between, for example, 900° C. and 950° C., the oxide of the layer 4 creeps and relaxes the stress within the structure.

On the other hand, during the return to room temperature after the epitaxy, the oxide layer 4 causes a stress that compensates the stress imposed by the SiGe layer deposited in the front side.

The structure illustrated in FIG. 2 is thereby obtained, which may be free of bow or may have a bow that is at least sufficiently low to enable handling of the structure by conventional tools in the microelectronics industry.

According to a second embodiment, illustrated in FIGS. 9A to 9D, the well-known SMARTCUT™ method is used to form an SOI substrate comprising the support substrate, the electrically insulating layer, and a silicon seed layer intended for the epitaxial growth of the SiGe layer.

To this end, a donor silicon substrate 40 covered by the electrically insulating layer 2 (cf. FIG. 9A) is supplied, then an embrittlement zone 41 delimiting a silicon layer 42 to be transferred (cf. FIG. 9B) is formed by implantation of atomic species.

A receiver substrate, which is typically the support substrate 1 of the final substrate, is also provided.

Figure 9A:
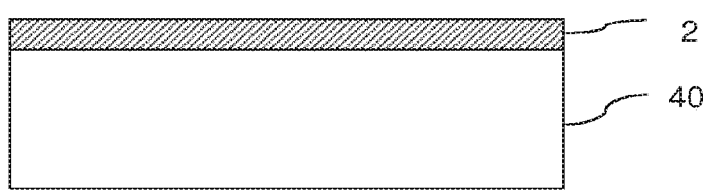
FIGS. 9A to 9E illustrate the main steps of a method of manufacturing a structure according to another embodiment of the present disclosure.
Figure 9B:
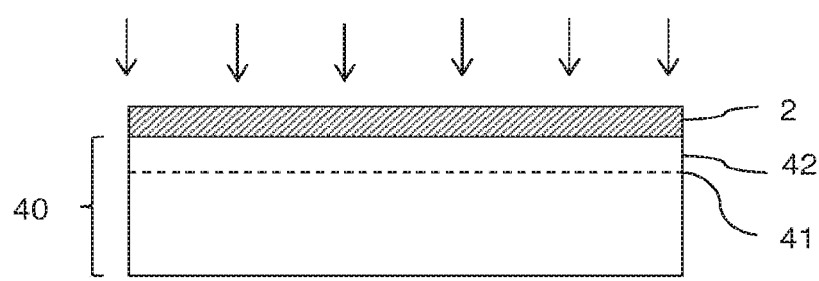
Figure 9C:
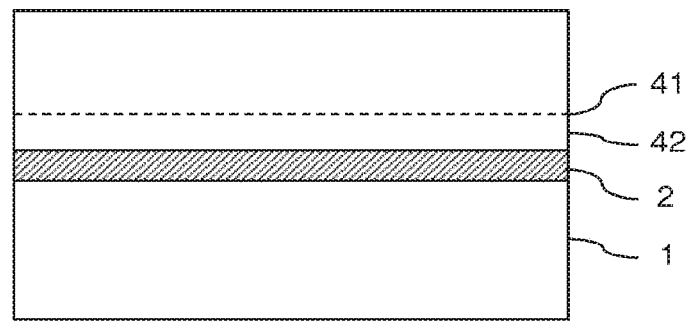

With reference to FIG. 9C, the donor substrate 40 is bonded to the support substrate 1, the electrically insulating layer 2 being at the bonding interface.

Next, the donor substrate is detached along the embrittlement zone. The detachment may be initiated by any known technique, such as by application of mechanical, chemical and/or thermal stress.

Figure 9D:
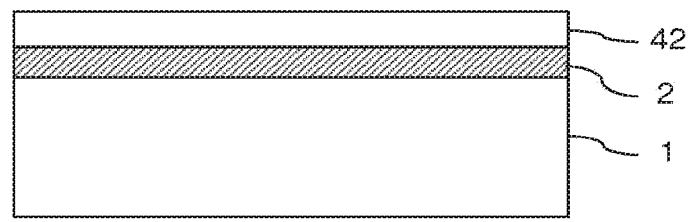

The silicon layer 42 is thereby transferred onto the support substrate 1 (cf. FIG. 9D).

Figure 9E:
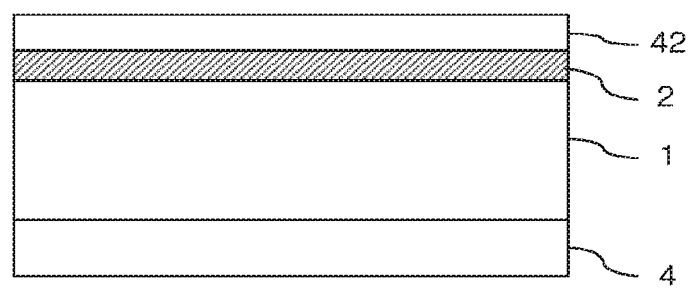

With reference to FIG. 9E, a silicon oxide layer 4 is deposited at low temperature (on the order of 300° C.) on the rear side of the support substrate 1. As indicated above, the thickness of the layer 4 is chosen so as not to generate a bow greater than 100 µm upon return to room temperature, and to compensate the bow generated by the later epitaxy of the SiGe layer. The thickness of the layer 4 is, for example, on the order of 1.4 µm.

If need be, a surface treatment of the silicon layer may be performed to remove defects linked to the implantation and to the detachment, and to make it sufficiently smooth for the subsequent epitaxy process.

Finally, epitaxy of SiGe on the transferred silicon layer 42, which serves as a seed layer is then resumed, until the desired thickness for the active layer 3 is obtained. During epitaxy, it is possible to lightly dope the active layer 3, depending on the desired electrical properties.

The substrate illustrated in FIG. 6 is thereby obtained.

As mentioned above, the silicon seed layer may be kept for the formation of the imager. Alternatively, the silicon layer may be removed by means of the aforesaid condensation method.

Figure 10:
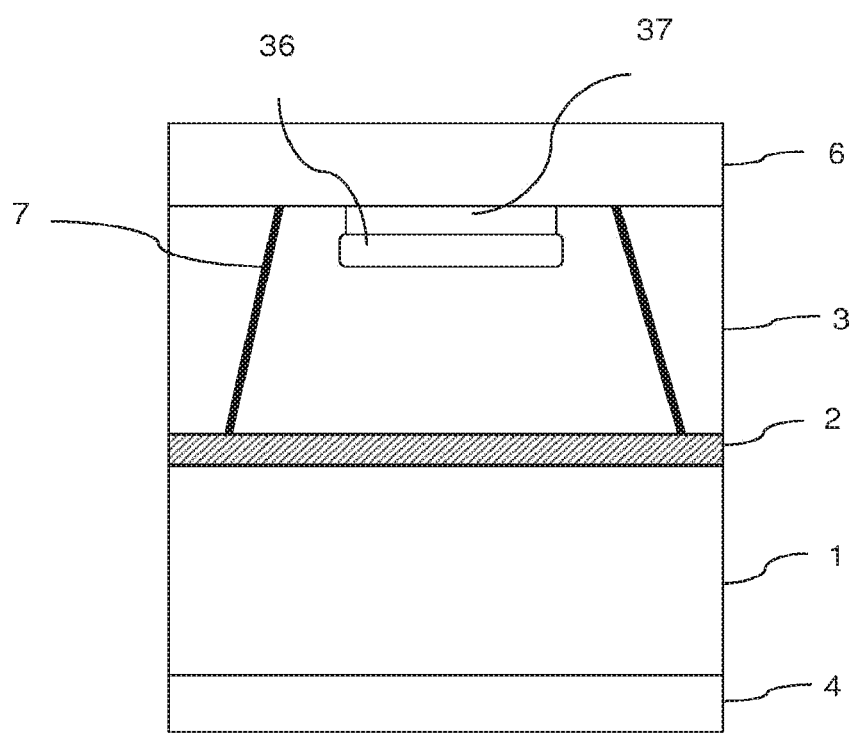
FIG. 10 is a sectional view of a pixel of a "front side" type imager comprising a structure according to one embodiment of the present disclosure.

FIG. 10 illustrates a part of a front side type imager comprising a substrate according to one embodiment of the present disclosure corresponding to FIG. 2, but not limited thereto. Only a part of the imager corresponding to a pixel is represented in this figure, the pixel being electrically insulated from the other pixels formed in the active layer 3 by insulation trenches 7.

A doped region 36 of a different type from that of the active layer 3 is formed under the surface of the front side of the active layer 3. This region 36 forms the active layer 3 of a photodiode. A region 37 formed between the region 36 and the front side of the active layer 3 advantageously has a doping level greater than that of the region 36 in order to passivate the interface. A passivation layer 6 is formed on the active layer 3 and may encapsulate elements making it possible to electrically control the pixel.

Potentially, other layers, such as filters, may be formed on the passivation layer 6, but they are not represented in FIG. 10.

The structure of the active components of the imager and the methods of manufacturing such components are known in the art and are thus not described in detail herein.

The invention claimed is:

1. A method of manufacturing a semiconductor on insulator structure comprising:
   providing a donor substrate comprising a semiconductor material suitable for epitaxial growth of a material of an active layer thereon;
   providing a support substrate;
   bonding the donor substrate to the support substrate, an electrically insulating layer being at a bonding interface;
   thinning the donor substrate so as to transfer a layer of the semiconductor material onto a front side of the support substrate;
   depositing a silicon oxide layer on a rear side of the support substrate at a first temperature; and after depositing the oxide layer, epitaxially growing the active layer on the transferred layer of semiconductor material at a second temperature greater than the first temperature.

2. The method of claim 1, wherein the active layer comprises silicon-germanium.

3. The method of claim 2, wherein the semiconductor material of the donor substrate comprises silicon-germanium.

4. The method of claim 3, wherein the semiconductor material is formed by epitaxy on a base substrate, the semiconductor material and the base substrate together forming the donor substrate.

5. The method of claim 2, wherein the semiconductor material of the donor substrate comprises silicon.

6. The method of claim 5, wherein a thickness of the silicon layer transferred onto the support substrate is less than or equal to 400 nm.

7. The method of claim 5, wherein the silicon layer remains between the electrically insulating layer and the silicon-germanium layer after epitaxially growing the active layer comprising silicon-germanium.

8. The method of claim 5, further comprising condensation of the silicon-germanium of the active layer so as to convert the silicon layer into a silicon-germanium layer.

9. The method of claim 1, comprising forming an embrittlement zone in the donor substrate so as to delimit a layer of the semiconductor material suitable for the epitaxial growth of the material of the active layer, and wherein the thinning of the donor substrate comprises a detachment along the embrittlement zone.

10. The method of claim 9, wherein the formation of the embrittlement zone comprises an implantation of atomic species in the donor substrate.

11. The method of claim 1, wherein the second temperature is between 600 and 1100° C.

12. The method of claim 1, wherein the first temperature is between 100 and 400° C.

13. The method of claim 1, wherein a thickness of the silicon oxide layer is selected such that stress generated upon cooling the semiconductor on insulator structure after depositing the silicon oxide layer due to a difference in thermal expansion coefficient between the silicon oxide layer and the support substrate results in the semiconductor on insulator structure having a bow less than a predefined limit value.

* * * * *

UNITED STATES PATENT AND TRADEMARK OFFICE
CERTIFICATE OF CORRECTION

PATENT NO. : 11,127,624 B2
APPLICATION NO. : 16/495362
DATED : September 21, 2021
INVENTOR(S) : Walter Schwarzenbach, Oleg Kononchuk and Ludovic Ecarnot Page 1 of 1

It is certified that error appears in the above-identified patent and that said Letters Patent is hereby corrected as shown below:

In the Specification
Column 5, Line 48, change "cm 1" to --$cm^{-1}$--
Column 6, Line 29, change "+300 m" to --+300 µm--

Signed and Sealed this
Ninth Day of November, 2021

Drew Hirshfeld
*Performing the Functions and Duties of the
Under Secretary of Commerce for Intellectual Property and
Director of the United States Patent and Trademark Office*